United States Patent
Willer et al.

(10) Patent No.: US 7,416,976 B2
(45) Date of Patent: Aug. 26, 2008

(54) METHOD OF FORMING CONTACTS USING AUXILIARY STRUCTURES

(75) Inventors: Josef Willer, Riemerling (DE); Patrick Haibach, Munich (DE); Christoph Andreas Kleint, Dresden (DE); Nicolas Nagel, Dresden (DE)

(73) Assignee: Infineon Technologies AG, Munich (DE)

( * ) Notice: Subject to any disclaimer, the term of this patent is extended or adjusted under 35 U.S.C. 154(b) by 430 days.

(21) Appl. No.: 11/217,122

(22) Filed: Aug. 31, 2005

(65) Prior Publication Data

US 2007/0048993 A1 Mar. 1, 2007

(51) Int. Cl.
*H01L 21/44* (2006.01)
(52) U.S. Cl. ............... 438/666; 438/597; 438/640; 257/E21.476
(58) Field of Classification Search ......... 438/597, 438/640, 647, 655, 657, 659, 666, 684; 257/E21.476
See application file for complete search history.

(56) References Cited

U.S. PATENT DOCUMENTS

| | | | |
|---|---|---|---|
| 6,200,860 B1 * | 3/2001 | Chiang et al. | 438/266 |
| 6,593,190 B2 * | 7/2003 | Lee et al. | 438/262 |
| 6,744,096 B2 * | 6/2004 | Lee et al. | 257/316 |
| 6,972,226 B2 | 12/2005 | Deppe et al. | |
| 7,183,600 B2 * | 2/2007 | Kim et al. | 257/295 |
| 7,184,291 B2 | 2/2007 | Bollu et al. | |
| 7,326,613 B2 * | 2/2008 | Yun et al. | 438/244 |
| 2002/0020890 A1 | 2/2002 | Willer | |
| 2004/0195596 A1 | 10/2004 | Wang et al. | |
| 2005/0164451 A1 * | 7/2005 | Ogura et al. | 438/257 |
| 2005/0227426 A1 | 10/2005 | Deppe et al. | |
| 2007/0077748 A1 * | 4/2007 | Olligs et al. | 438/618 |

FOREIGN PATENT DOCUMENTS

DE 102 58 194 A1 7/2004

* cited by examiner

*Primary Examiner*—Scott B. Geyer
*Assistant Examiner*—Angel Roman
(74) *Attorney, Agent, or Firm*—Slater & Matsil, L.L.P.

(57) ABSTRACT

A semiconductor product includes a substrate having a substrate surface. A plurality of wordlines are arranged at a distance from one another and running along a first direction. A plurality of conductive contact structures are provided between the wordlines. The product also includes a plurality of filling structures. Each filling structure separates from one another two respective contact structures arranged between two respective wordlines. The two respective contact structures are arranged at a distance from one another in the first direction. In the preferred embodiment, the contact structures have a top side provided at a distance from the substrate surface and extends to the substrate surface. The contact structures at the substrate surface have a width along the first direction that is larger than a width of the top sides of the contact structures along the first direction.

22 Claims, 10 Drawing Sheets

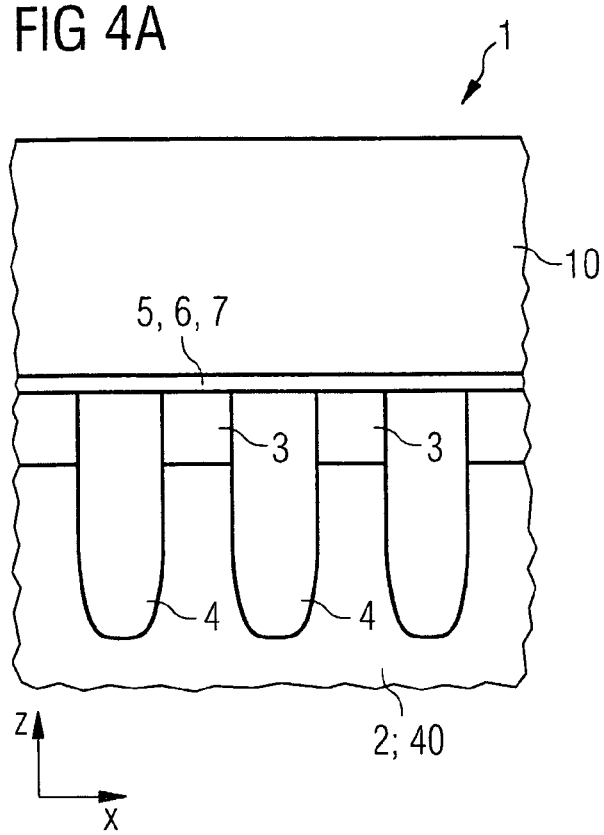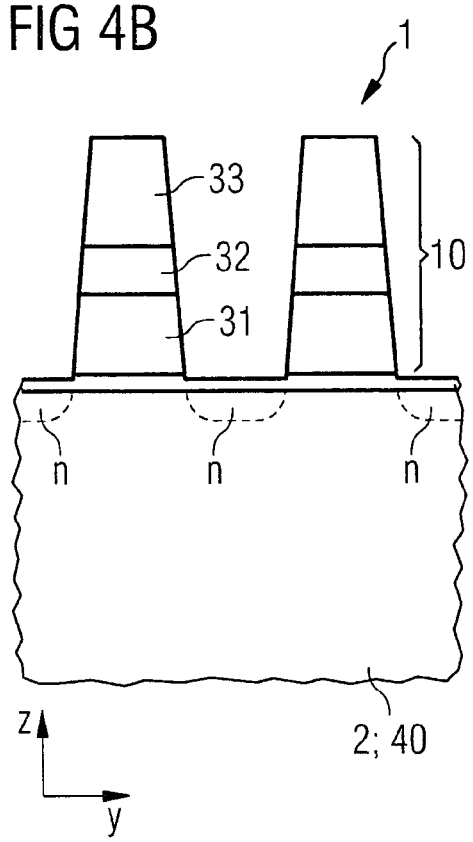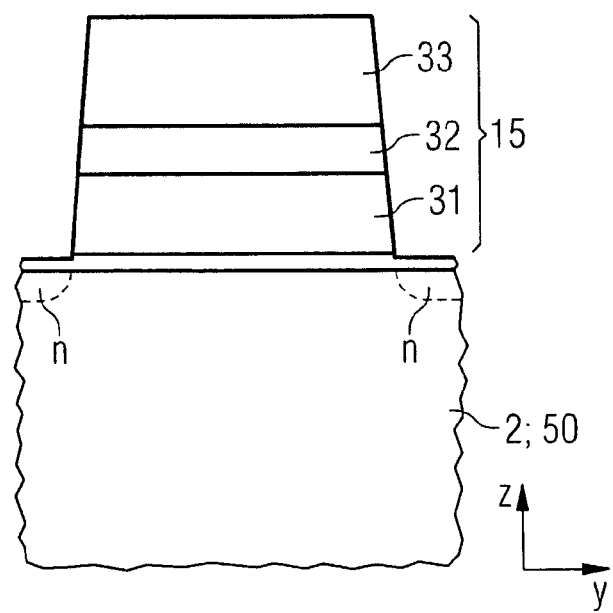

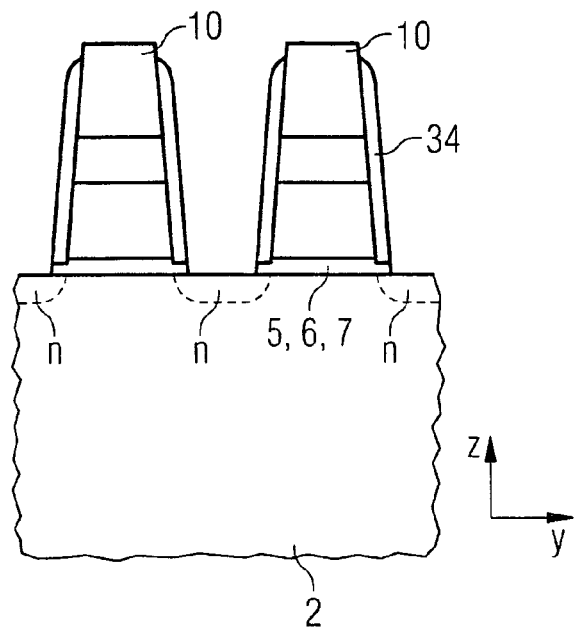
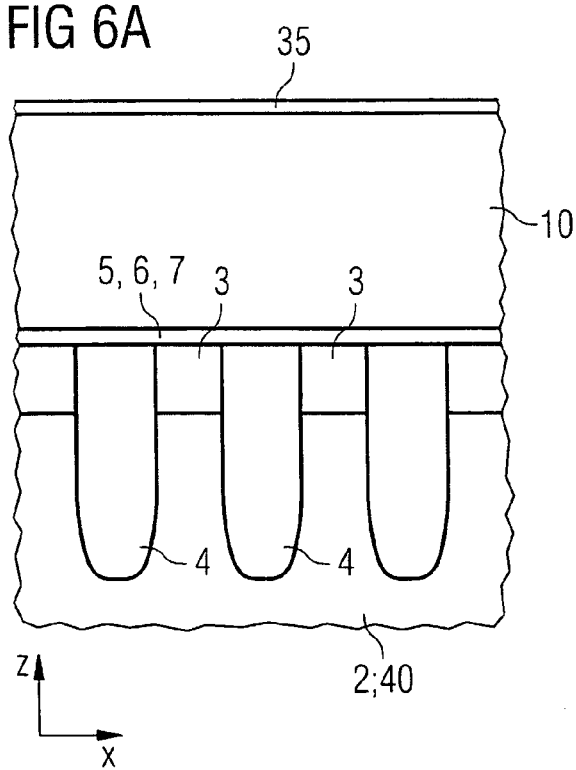
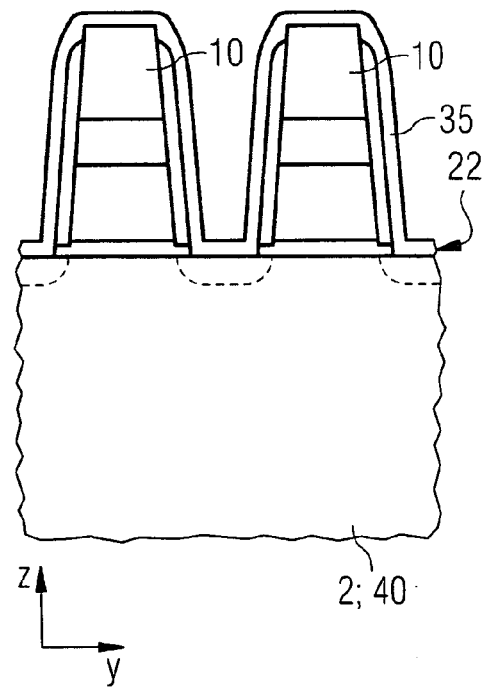

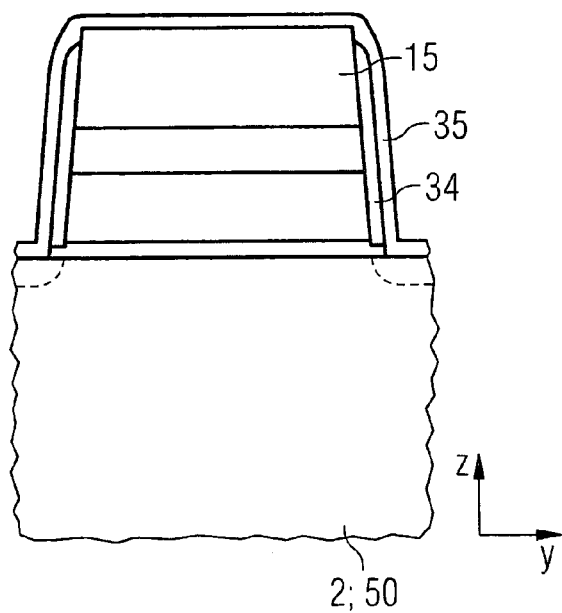
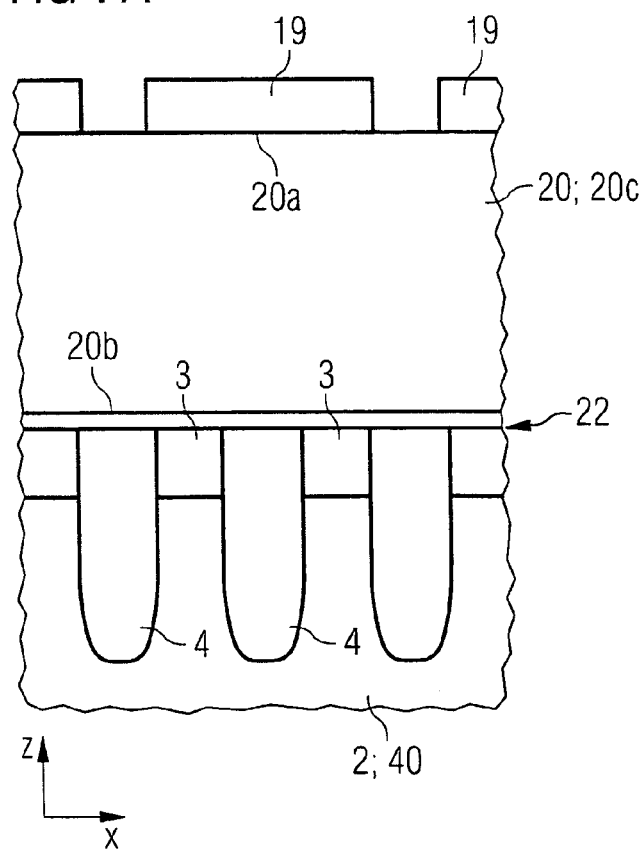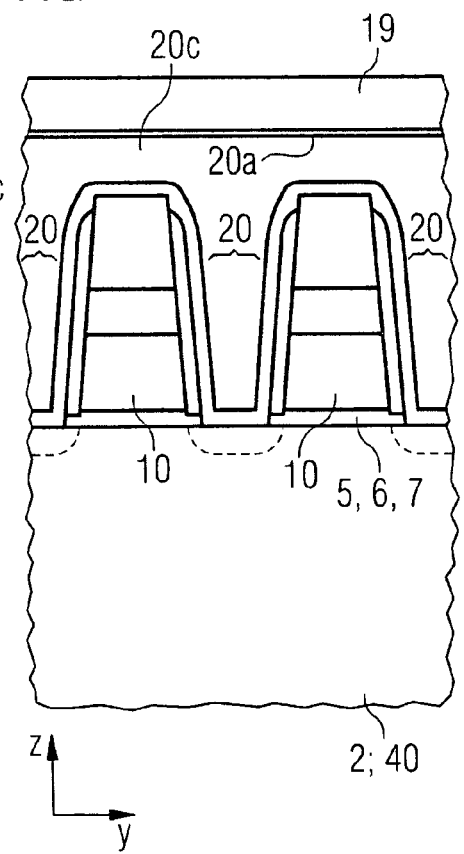

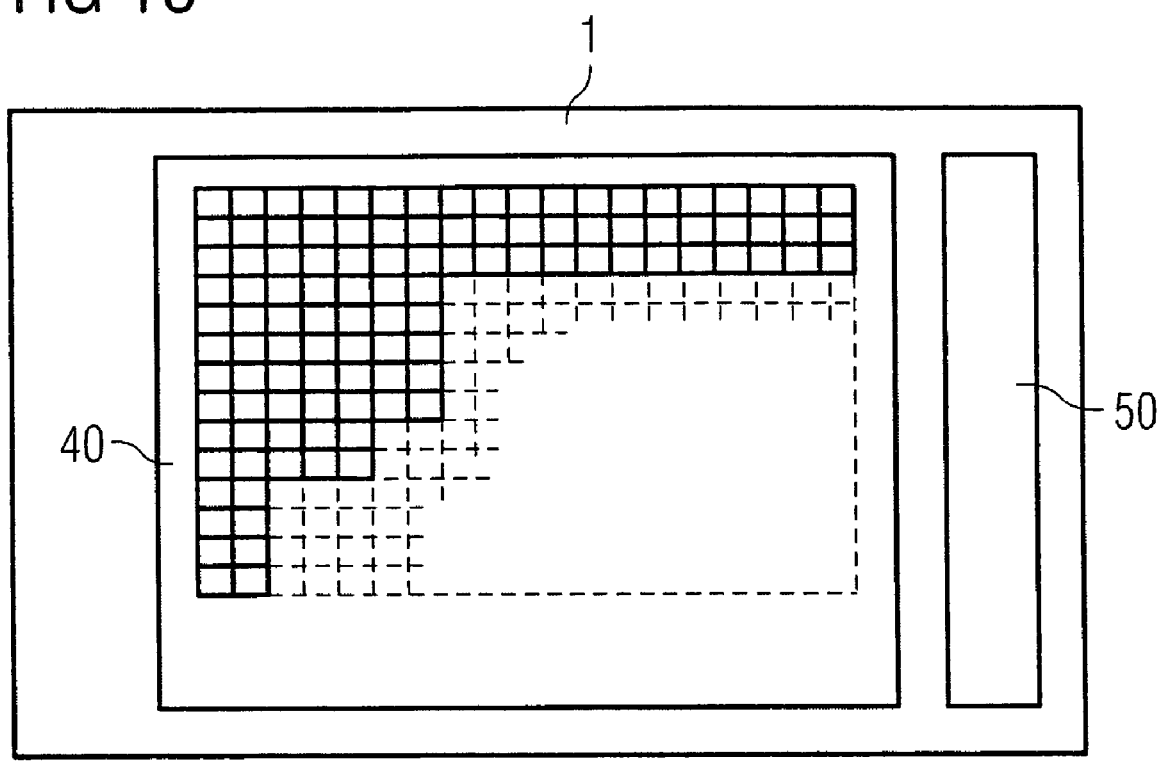

METHOD OF FORMING CONTACTS USING AUXILIARY STRUCTURES

TECHNICAL FIELD

The invention refers to a semiconductor product such as a memory device and to a method for forming a semiconductor product.

BACKGROUND

Such a semiconductor product may be, for instance, a flash memory product comprising a plurality of memory cells like NROM (nitride read only memory) or alternative kinds of non-volatile memory cells (like floating gate cells). In a flash memory product, the memory cells are programmable individually selectively to the respective other memory cells. When information is deleted, all memory cells of the same particular sector are commonly deleted at the same time. The memory cells of the respective sector may be later reprogrammed individually.

The memory cells of a flash memory are arranged in a virtual ground array or in other array architectures. Each memory cell is connected to two respective bitlines running parallel to one another. In a virtual ground array each bitline is connected to memory cells arranged on opposed sides of the bitline. Connection between the bitlines and the memory cells is provided by contact structures that comprise first contacts called "local interconnect". The local interconnects are arranged in rows extending perpendicular to the direction of the bitlines. In a direction parallel to the bitlines, a bitline is connected to one respective local interconnect of every other row of local interconnects. Furthermore, in every other row, the local interconnects have a lateral offset relative to the lateral positions of the local interconnects of the other rows of local interconnects. Each bitline is connected to local interconnects of every other row (for instance of a first, third, fifth, etc., row) whereas the bitline is passing over memory cells of a second, fourth, sixth, etc., row of local interconnects without being connected to the local interconnects of the second, fourth and sixth rows.

In a virtual ground array, the bitlines are connected to the memory cells via contact structures that, according to prior art, comprise a first contact called "local interconnect". The local interconnects are contact hole fillings provided in a dielectric layer above a substrate. The local interconnects are wide via contacts having a main extension in a first lateral direction perpendicular to the direction of the bitlines. They serve to connect two line-shaped active areas to a bitline. The active areas are doped regions providing the source/drain regions and the channel regions and, in a virtual ground array, are formed in lines or stripes separated from one another by trench isolation fillings like shallow trench isolations (STI). The trench isolation fillings as well as the active areas are formed line-shaped seen from top view on the semiconductor substrate. When the bitlines are formed, they are positioned such that they are running parallel to the active areas but are, for instance, located at same lateral positions as the shallow trench isolation fillings, that is at centered lateral positions between two respective adjacent line-shaped active areas.

The local interconnects contacts, in direction perpendicular to the active areas, extend beyond the bitlines on opposed sides of the respective bitline. In particular, the local interconnects extend to the active areas next to the bitline positioned on opposed sides of the bitline. Typically, a local interconnect has a width being approximately three times the width of the bitline since the width of the active areas and the width of the trench isolation fillings between the active areas correspond to one another.

In order to connect the bitline to the local interconnects, which are much wider than the bitlines, bitline contacts (the "contacts to interconnect") are formed according to prior art. To this end, a dielectric layer is deposited and via contact holes are etched in the dielectric layer so as to expose a portion of an upper surface of the local interconnects. The contact holes in the second dielectric layer are then filled with conductive material. By planarizing the conductive material, the contacts to interconnect are formed. Subsequently, the bitlines are formed.

In the process of manufacturing the semiconductor product, a substrate is provided and a plurality of line-shaped active areas as well as a plurality of line-shaped trench isolation fillings disposed between respective two active areas are formed in the substrate. Subsequently, a layer stack comprising a bottom oxide layer, a charge-trapping layer like a silicon nitride layer, and a top oxide layer are deposited. Wordlines are then formed by depositing one or more conductive layers and a cap nitride layer for forming gate stacks. These layers are then pattered thereby forming a plurality of wordlines. Sidewall spacers are then formed on sidewalls of the wordlines in a conventional manner.

Thereby a plurality of wordlines arranged at a distance from one another and running, at least in a region of the substrate surface, along a first direction, are provided. In spaces left between respective two wordlines the contact structures (the local interconnects) are to be formed thereafter. Conventionally, a dielectric layer is deposited and etched so as to form a plurality of filling structures filling one respective longitudinal space between two respective wordlines. Furthermore, in a conventional process these longitudinal filling structures are patterned along the first direction, thereby etching a plurality of trenches at those positions where the contact structures (the local interconnects) are to be formed. Each trench extends through the complete thickness of the respective filling structure down to the substrate surface. Thereafter, conductive material is deposited and an upper position thereof is etched, thereby forming a plurality of contact structures in the trenches within the filling structures.

Thereby a semiconductor product is provided that comprises contact structures filled in vias, which vias are confined, on opposed sides along the first direction, by sidewalls of respective two portions of the filling structure (which portions have been separated from one another during trench etching). Along the second direction, the contact structures are confined by respective two wordlines (that is, by their spacers).

Each contact structure formed in this way contacts two active areas arranged at a distance from one another along the first direction. Typically, the width of the active area corresponds to the width of the trench isolation filling provided therebetween. The width of the contact structure in the first direction accordingly is approximately three times the width of an active area or of a trench isolation filling, along the first direction.

However, the exact value of the width of the contact structure along the first direction, that is in direction parallel to the main extension of the wordlines between which the contact structures are provided, varies with the vertical position within the contact structure. In particular, the width of the contact structure along the first direction, measured at the top side of the contact structure, usually is larger than the width of the contact structure along the first direction, measured at a bottom side of the contact structure. Conventionally, the width of the contact structure (that is its extension in the first direction) increases with increasing distance from the substrate surface. In a cross-sectional view the shape of the contact structure corresponds to a trapezium having its long base at the top side of the contact structure and having its short base on the substrate surface.

This shape of the contact structures result from the circumstance that the contact structures are etched into dielectric filling structures filling the spaces between the wordlines. Etching of the trenches to be filled with the contact structures is performed by dry etching, for instance by reactive ion etching. Due to the typical etching profile of this anisotropic etching technique, at the top side of the insulating filling structures the trenches are slightly wider than at the bottom of the insulating filling structures (that is on the substrate surface). The reason therefor is that the duration of contact between the etching component and the etched sidewall of the remaining portions of the insulating filling structure decreases with increasing depth of the trench.

Due to conventional lithographic patterning, microelectronic structures have lateral dimensions corresponding to the critical dimension. The magnitude of the critical dimension depends on the wavelength used for the specific technology of lithography. However, with a predefined critical dimension the lateral extensions of the microelectronic structures are defined.

In semiconductor manufacturing the risk of lateral misalignment occurs. Since a mask for etching the trenches in the dielectric filling structures may be misaligned along the first direction relative to the active areas, the trenches to be filled with the contact structures may be offset in the first direction with respect to the active areas to be contacted. Depending on the extent of such lateral offset, the contact interface surface between one of the two active areas to be contacted and the contact structure is less, in the first direction, than the critical dimension whereas the contact structure extends beyond the other active area in the first direction. Accordingly, any lateral offset in the first direction bears the risk of increased contact resistance between the contact structure (the local interconnect) and one of the two active areas to be contacted.

Furthermore, due to the sloped sidewalls of the contact structures seen in cross-sectional view parallel to the worldlines, the width of the contact structures, measured at the substrate surface along the first direction, is actually smaller than three times the critical dimension (at the top side the width of the contact structures exceed a magnitude of three times the critical dimension). Accordingly, even in the absence of any lateral offset in the first direction, the contact interface surface between the contact structure and each active area is smaller in the first direction than the critical dimension. Thereby the contact resistance between the active areas and the contact structures (the local interconnects) is further increased.

SUMMARY OF THE INVENTION

In one aspect, embodiments of the present invention provide a semiconductor product with reduced contact resistance between the contact structures and the active areas, even in the case that the contact structures are misaligned or laterally offset relative to the active areas. In a further aspect, embodiments of the present invention provide a method for forming such a semiconductor product.

According to embodiments of the invention, a semiconductor product includes a substrate having a substrate surface. A plurality of wordlines are arranged at a distance from one another and running along a first direction. A plurality of conductive contact structures are provided between the wordlines. The product also includes a plurality of filling structures. Each filling structure separates from one another two respective contact structures arranged between two respective wordlines. The two respective contact structures are arranged at a distance from one another in the first direction. In the preferred embodiment, the contact structures have a top side provided at a distance from the substrate surface and extending to the substrate surface. The contact structures at the substrate surface have a width along the first direction that is larger than a width of the top sides of the contact structures along the first direction.

According to embodiments of the invention, a semiconductor product is provided that includes contact structures of reversed cross-sectional shape along the first direction with regard to the distance from the substrate surface. According to various embodiments, the width of the contact structures in the first direction, that is parallel to the wordlines, is comparatively large at the substrate surface and is comparatively low at the top side of the contact structures. Whereas in a conventional semiconductor product the slope of the sidewalls of the contact structures is such that the maximum width of the contact structures in the first direction is achieved at the top side of the contact structures, according to embodiments of the invention the maximum width in the first direction is achieved at the substrate surface, that is at the bottom of the contact structures. Accordingly, the cross-sectional shape of the contact structures, in the plane spanned by the first direction parallel to the wordlines and the vertical direction perpendicular to the substrate surface, is mirror-inverted compared to prior art. Nevertheless, in the plane spanned by a second lateral direction perpendicular to the wordlines and the vertical direction, the cross-sectional shape of the contact structures is unchanged since the slope of the sidewalls of the wordlines is unchanged. However, in a direction parallel to the wordlines, the width of the contact structures increases from the top side of the contact structures in direction to the substrate surface (that is at the bottom side of the contact structures).

Whereas a conventional contact structure does not contact the complete surface of the respective two active areas to be contacted and bears the risk of additional increase of contact resistance in case of a lateral offset in the first direction, according to embodiments of the invention the contact structures at their bottom side are wider than preferably three times the critical dimension. As a consequence, they extend in negative first direction as well as in positive first direction beyond the outer, opposed ends of the respective two active areas. Thereby the whole top surface of the active areas is contacted by the contact structure even in case of a lateral offset of the contact structure along the first direction.

The contact structures are disposed between the filling structures and are separating them from one another, and the filling structures have a bottom side and a top side, a distance between the top side of the filling structures and the substrate surface being larger than a distance between the bottom side of the filling structures and the substrate surface. The width of the top sides of the filling structures along the first direction is larger than a width of the bottom sides of the filling structures along the first direction. The filling structures each are confined in the first direction by two opposed contact structures. Accordingly, in a space between two wordlines adjacent to one another, along the first direction (running parallel to the wordlines) this space is filled with a filling structure, a contact structure, another filling structure, another contact structure, yet another filling structure, yet another contact structure and so on in alternative manner. Accordingly, each contact structure is confined by two wordlines (along the second lateral direction) and by two filling structures (along the first lateral direction) and each filling structure is confined by two wordlines (along the second lateral direction) and by two contact structures (in the first lateral direction).

Preferably the contact structures are made of a semiconductor material, for instance of doped silicon or doped polysilicon. The semiconductor material may be an epitaxial monocrystalline material that has been grown epitaxially on the substrate surface. In particular, the semiconductor material may be doped monocrystalline silicon.

Preferably the contact structures comprise a contact structure portion extending into trenches provided in the substrate. Preferably the substrate comprises active areas, the active areas being formed line-shaped and extending along the second direction different from the first direction. The second direction preferably is a second lateral direction orthogonal to the first direction.

Preferably the substrate comprises trenches arranged between the active areas and being filled with trench isolation fillings, each trench isolation filling being formed line-shaped and isolating two respective active areas from one another. The trench isolation fillings may be shallow trench isolations (STI) or deep trench isolations (DTI). They are filled with dielectric material like an oxide, for instance. In the plane of the main surface of the substrate, stripes of active areas and stripes of trench isolation fillings are arranged in alternating manner.

Preferably, each contact structure contacts two respective active areas and is passing across one respective trench isolation filling. According to a preferred embodiment, the trench isolation filling disposed between the two active areas contacted by the respective contact structure is recessed compared to the substrate surface, the contact structure portion of the contact structure being arranged in an upper portion of the trench and extending to the recessed trench isolation filling. Accordingly, in the center between two contacted active areas the contact structure extends into the trench of the trench isolation filling and contacts sidewalls of the active areas. Thereby a considerable decrease in contact resistance is achieved since both the top surfaces and one respective sidewall of each active area are contacted by the contact structure. Depending on the depth of the contact structure portion, the interface surface to the active areas may be increased up to two or three times the top surface of an active area, for instance.

Preferably each contact structure is covering portions of two further trench isolation fillings, filling structures adjacent to the contact structure covering further portions of the two further trench isolation fillings. Accordingly, at the substrate surface the contact structure extends beyond both active areas along positive and negative first direction so as to abut to surface portions of two further trench isolation fillings. However, most parts of the top surface of these further trench isolation fillings are covered with the dielectric filling structures provided on opposed sides of the contact structure. Accordingly no risk of short circuits to further active areas occurs.

Preferably the semiconductor product comprises bitline contacts electrically contacting the contact structures. The bitline contacts (contacts to interconnect) serve to electrically connect the contact structures (local interconnects) and the bitlines to one another.

Preferably the bitline contacts each are arranged on the respective contact structure in a centered position along the first direction between the two respective filling structures. The lateral extension of a contact structure along the first direction is confined by the two adjacent insulating filling structures. The bitline contact however is smaller along the first direction than the contact structure since the contact structure is to be connected to the bitline passing over the contact structure in a centered position with regard to the first direction. The width of the bitline contact corresponds to the width of the bitline, which is approximately one third of the width of the contact structure. Thereby short circuits to adjacent bitlines are prevented.

Preferably the top sides of the contact structures are covered with metallic silicide layers, each silicide layer extending between the two filling structures disposed adjacent to the respective contact structure. The silicide layer may be a cobalt silicide layer, for instance. The silicide layer serves to reduce the resistance between the bitline and the active areas connected to the bitline via the contact structure and the bitline contact. In particular, in case that the contact structures are formed of a semiconductor material, the silicide layer on the top surface of the contact structure provides a large metal-semiconductor interface surface. Since the silicided top surface of the contact structure extends from a first adjacent filling structure to a second, opposed adjacent filling structure, the resistance is lower than in the case where the contact structure is formed of a metal and the metal-semiconductor interface surface is formed on top of the active areas, which have a smaller top surface compared to the top surface of the contact structure. The semiconductor material of the contact structure may be, for instance, monocrystalline silicon or polysilicon.

Another benefit of a salicide layer is that it can be grown selectively on silicon surfaces of an intermediate semiconductor product. Accordingly, the salicide layer may be formed selectively on the top surfaces of the silicon containing contact structures and only selective wet etching of non-reacted pure metal (but no back-etching or chemical-mechanically polishing) is required for removing the salicide layer from other structural elements of the integrated circuit. Furthermore, formation of a salicide layer may easily be integrated in a process of forming the semiconductor product since the product only needs to be tempered, for instance, at 800° C., in an inert atmosphere. During tempering, silicide formation at interface surfaces occurs.

Since the contact structures are preferably formed of monocrystalline silicon or polysilicon, reduced contact resistance to the active areas is achieved since deposition of monocrystalline silicon or of polysilicon occurs by means of chemical vapor deposition in a very low pressure atmosphere. In such a high vacuum any thin native oxide layer or other thin oxide layer on the active areas is removed due to the partial pressure of oxygen in the high vacuum.

Preferably the bitline contacts are arranged on an upper atmosphere of the respective silicide layer. The bitline contacts may be formed of a metal and may contact a metallic silicide layer like a cobalt silicide layer.

Preferably the top sides of the contact structures are arranged at a distance from the substrate surface smaller than a distance between the top sides of the filling structures and the substrate surface. Accordingly, the vertical extension of the contact structures is smaller than the vertical extension of the adjacent insulating filling structures and the bitline contacts are vertically extending between the filling structures down to the contact structures.

Alternatively, the upper surfaces of the silicide layer and the top side of the filling structures are arranged at a same distance from the substrate surface.

Preferably the bitline contacts are provided in vias of a dielectric layer covering the wordlines, the contact structures and the filling structures. Accordingly a damascene technique is used for forming the bitline contacts. Preferably the semiconductor product comprises bitlines, the bitlines passing over the bitline contacts and running along the second direction. Preferably the second direction is a lateral direction perpendicular to the first (lateral) direction.

According to a preferred embodiment the semiconductor product comprises portions of a charge-trapping layer arranged between the active areas and the wordlines. Preferably each portion of a charge-trapping layer is sandwiched between a bottom oxide layer and a top oxide layer. The charge-trapping layer preferably is a silicon nitride layer. The charge-trapping layer may further be sandwiched between dielectric layers comprising other materials than oxides.

The bottom oxide layer, the charge-trapping layer and the top oxide layer form a layer stack. Each active area portion arranged below a wordline is covered with one layer stack, the bottom oxide layer being provided on the active area and the wordline contacting a top surface of the top oxide layer. Due to the charge-trapping layer, a plurality of memory cells, preferably twin flash memory cells is provided in the semiconductor product. The layer stacks in lateral direction perpendicular to the wordline extend between two respective contact structures.

The semiconductor product comprises a memory array with a plurality of non-volatile memory cells. The memory cells can be NROM cells (nitride read only memory) or floating gate transistor cells, for instance.

The filling structures preferably are electrically insulating. They may be formed of an insulating dielectric material. They also may comprise a dielectric material. The dielectric material for instance may be a dielectric liner, for instance made of silicon nitride. An inner portion of filling structures may be conductive or insulating. The silicon nitride layer electrically insulates the inner portion of the filling structure from the contact structures. A further benefit of the silicon nitride layer is that it can be used as an etch stop for chemical-mechanical polishing and furthermore serves as a diffusion barrier.

Preferably at the substrate surface the contact structures contacting two respective active areas extend beyond the two contacted active areas in the first direction parallel to the wordlines.

In another aspect, the invention provides an embodiment of a method for forming a semiconductor product. For example, one embodiment method includes the following steps:

a) providing a substrate having a substrate surface;

b) forming wordlines arranged at a distance from one another and running along a first direction parallel to the substrate surface;

c) forming auxiliary structures between the wordlines, the auxiliary structures filling spaces between the wordlines above the substrate surface and having a top side and a bottom side, a distance between the top side and the substrate surface being larger than a distance between the bottom side and the substrate surface;

d) patterning the auxiliary structures thereby forming trenches extending through the auxiliary structures from the top sides to the bottom sides, in each auxiliary structure plural trenches being formed, which trenches are arranged at a distance from one another along the first direction, the trenches having a width along the first direction being larger at the top side of the auxiliary structures than at the bottom side of the auxiliary structures;

e) filling the trenches formed in the auxiliary structure with filling structures;

f) removing the auxiliary structures by etching, thereby exposing sidewalls of the filling structures; and g) forming conductive contact structures for contacting the substrate surface in between the filling structures, the contact structures having a top side provided at a distance from the substrate surface, the contact structures extending to the substrate surface and having a width at the substrate surface, which width along the first direction is larger than a width of the top sides of the contact structures along the first direction.

According to this embodiment, auxiliary structures formed between the wordlines in step c) are patterned in step d) so as to form trenches extending to the substrate surface. The trenches are vias that are filled with the filling structures in step e). Subsequently, according to this embodiment the remaining portions of the auxiliary structures that have not been removed in step d) are removed in step f), preferably by etching, so as to form further trenches to be filled with the contact structures grown in step d). In prior art methods, the conductive material for forming the contact structures first is deposited between the wordlines and subsequently is patterned to form trenches that are filled with the filling structures. According to this embodiment, however, the auxiliary structures, which fill the complete space between respective two adjacent wordlines, are formed and the filling structures are formed therein first (by patterning the auxiliary structures to form trenches therein and by filling the trenches with the filling structures) before forming the conductive structures later (by removing the remaining portions of the auxiliary structures between the filling structures in step f) and by subsequently forming the contact structures in step g)). Accordingly, the temporal order of forming the filling structures and the contact structures according to this embodiment is reversed compared to prior art.

Furthermore, the filling structures are not formed by patterning a filling structure material. Instead, the material for forming the filling structures is deposited in trenches of the auxiliary structure, that is in a material deposited before forming the filling structures. Since the cross-sectional shape of the trenches etched in step d) is wider with increasing distance from the substrate surface, the filling structures are narrow on the substrate surface and are wide on their top surface. Since the remaining portions of the auxiliary structures between the filling structures are removed and material forming the contact structures is deposited, the contact structures are comparatively wide in lateral direction parallel to the wordlines at the substrate surface and are comparatively small in this direction at their top surface. Accordingly, the slope of the sidewalls of the contact structures abutting to the filling structures is reversed compared to prior art. Typically, the width of the contact structures at the substrate surface is slightly larger than three times the critical dimension and at their top surface is slightly smaller than three times the critical dimension, for instance.

Furthermore, the width of the contact structures along the first lateral direction (parallel to the wordlines) exceeds the two active areas to be contacted. Thereby the electrical resistance between the contact structures and the active areas is reduced.

Preferably step g) includes growing the contact structures selectively on the substrate surface exposed between the wordlines and the filling structures. More preferably, step g) includes expitaxially growing the contact structures selectively on the substrate surface exposed. By expitaxially growing a semiconductor material selectively on the exposed portions of the substrate surface (in particular on the active areas), no step of back-etching or polishing is required for removing undesired portions of semiconductor material.

Preferably silicon is grown on the exposed substrate surface in step g). In particular polysilicon or doped monocrystalline silicon is grown. Alternatively, carbon or germanium may be grown instead on the substrate surface.

Preferably step d) includes forming a mask on the auxiliary structures, the mask having mask openings extending perpendicular to the first direction, and anisotropically etching the auxiliary structures through the mask. The mask serves to etch trenches into the auxiliary structures, thereby forming a respective plurality of auxiliary structure portions separated from one another along the first direction by the trenches etched. Between each two adjacent wordlines a respective plurality of structure portions separated from one another along the first direction is formed thereby. Accordingly, the mask comprises mask openings crossing over the auxiliary structures (or over the auxiliary structures and the wordlines) in a second direction perpendicular to the main direction of the wordlines. The trenches are then filled with the material of the filling structures.

Preferably step e) includes depositing a dielectric material into the trenches. Alternatively, step e) may include forming a silicon nitride liner (or a liner of another material) in the trenches prior to filling the trenches. The liner of silicon nitride serves to electrically insulate the contact structures from one another and further serves as a diffusion barrier as well as an etch stop for back-etching the material of the filling structures.

Preferably, in step e) electrically insulating filling structures are formed.

Preferably step f) includes selectively etching portions of the auxiliary structures maintained between the filling structures. Selective etching of the auxiliary structure portions may be performed selectively to the material of the filling structures and of the wordlines (including nitride spacers and a nitride top layer).

Preferably step a) includes providing a substrate comprising active areas formed line-shaped and extending along a second direction different from the first direction, the substrate further comprising trenches arranged between the active areas and filled with trench isolation fillings, each trench isolation filling being formed line-shaped and isolating two respective active areas from one another. Accordingly, in a direction parallel to the wordlines, the active areas and the trench isolation fillings are arranged in alternating order. The main extension of the active areas and of the trench isolation fillings is perpendicular to the wordlines.

Preferably in step f) etching is continued after the substrate surface at a bottom side of the portions of the auxiliary structures is exposed, thereby recessing trench isolation fillings arranged in the trenches between the two respective active areas. Continuing etching after exposing the top surfaces of the active areas serves to expose sidewalls of the active areas in order to additionally increase the contact surface between the active areas and the contact structures.

Preferably the trench isolation filling arranged between the respective two areas to be contacted by the contact structure is recessed by continuing etching in step f), thereby recessing the trench isolation filling and exposing sidewalls of the active areas. The depth of the recesses formed thereby preferably is larger than 0.2 times the critical dimension, for instance between 0.2 and 2.5 times the critical dimension, more preferably between 0.5 and 1.25 times the critical dimension below the substrate surface.

Preferably, in step g) contact structures each contacting two respective areas and passing across one respective trench isolation filling are formed.

Preferably, the method also includes the following steps:

h) forming bitline contacts electrically contacting the contact structures; and i) forming bitlines on the bitline contacts.

Preferably a dielectric layer is deposited between steps g) and h) and the bitline contacts are formed in vias of the dielectric layer. The dielectric layer covers the wordlines, the contact structures and the filling structures.

Preferably between steps g) and h) (before depositing the dielectric layer) a metallic silicide layer is formed on the top sides of the contact structures, on each contact structure the respective silicide layer extending between sidewalls of respective two filling structures disposed adjacent to the respective contact structure. The bitline contacts preferably are formed at centered positions of upper surfaces of the respective silicide layer. Accordingly, the bitline contacts are arranged in a centered position between two filling structures and have a width in the first lateral direction being about a third of the width of a contact structure. The width of the bitline contact for instance is between 0.85 and 1.2 of the critical dimension.

Preferably in step a) a substrate further comprising a charge-trapping layer sandwiched between a top oxide layer and a bottom oxide layer is provided, the bottom oxide layer being disposed on the substrate surface.

Preferably step c) includes depositing polysilicon and etching the deposited polysilicon in order to form a plurality of separate auxiliary structures, each auxiliary structure filling a space between two adjacent wordlines and having its main extension in a direction parallel to the wordlines.

Preferably the wordlines are wordlines provided in a memory array and the method further includes forming conductive lines for high voltage transistors in a periphery region, wherein in step c) spacers are formed on sidewalls of the conductive lines. According to this embodiment spacers are formed on sidewalls of gate stacks of transistors in the periphery region at the same time when the auxiliary structures are formed in the memory array. In particular, the auxiliary structures in the memory array and the spacers in the periphery region are formed of the same material deposited in step c). As in conventional spacer formation, spacer material deposition and subsequent anisotropic back-etch is performed. Formation of the auxiliary structures easily is performed simultaneously to forming the spacers in the periphery region without the need to include any additional process step. Accordingly, a material like polysilicon, for instance, is deposited on the memory array as well as on the periphery region and is subsequently etched anisotropically, thereby forming the plurality of auxiliary structures in the memory array and a plurality of spacers in the periphery region.

Preferably source/drain regions are formed in the periphery region by implantation of dopants, the spacers being used as an implantation mask during implantation of the dopants.

According to one embodiment, the spacers are removed in step d). Alternatively, the spacers may be maintained. If the spacers are removed, removal is performed in step d), that is at the same time when the trenches for the filling structures are etched into the auxiliary structures.

BRIEF DESCRIPTION OF THE DRAWINGS

The invention is described hereinbelow with reference to figures.

FIGS. 2 to 14B are cross-sectional views of a semiconductor product during method steps of a method according to the invention; and FIG. 15 is a schematical top view of the semiconductor product comprising a memory array and a periphery region.

The following list of reference symbols can be used in conjunction with the figures:

| | |
|---|---|
| 1 | Semiconductor product |
| 2 | Substrate |
| 3 | Active area |
| 4, 4a, 4b | Trench isolation filling |
| 5 | Bottom oxide layer |
| 6 | Charge-trapping layer |
| 7 | Top oxide layer |
| 8 | Trench |
| 10 | Wordline |
| 15 | Conductive line |
| 19 | Mask |
| 20 | Auxiliary structure |
| 20a | Top side of auxiliary structure |
| 20b | Bottom side of auxiliary structure |
| 20c | Auxiliary layer |
| 21 | Trench |
| 22 | Substrate surface |
| 23 | Dielectric liner |
| 24 | Contact structure |
| 24a | Top side of contact structure |
| 24b | Contact structure portion |
| 25 | Silicide layer |
| 26 | Bitline contact |
| 28 | Bitline |
| 30 | Filling structure |
| 30a | Top side of fillings transistor |
| 30b | Bottom side of filling structure |
| 30c | Sidewall of filling structure |
| 31 | First layer |
| 32 | Second layer |
| 33 | Third layer |
| 34 | Thin spacer |
| 35 | Oxide liner |
| 36 | LDD-regions |
| 37 | Source/drain regions |
| 38 | Spacer |
| 40 | Memory array |
| 50 | Periphery region |
| V; v | Width of filling structure |
| W; w | Width of contact structure |
| x | First direction |
| y | Second direction |
| z | Vertical direction |

DETAILED DESCRIPTION OF ILLUSTRATIVE EMBODIMENTS

Figure 1:
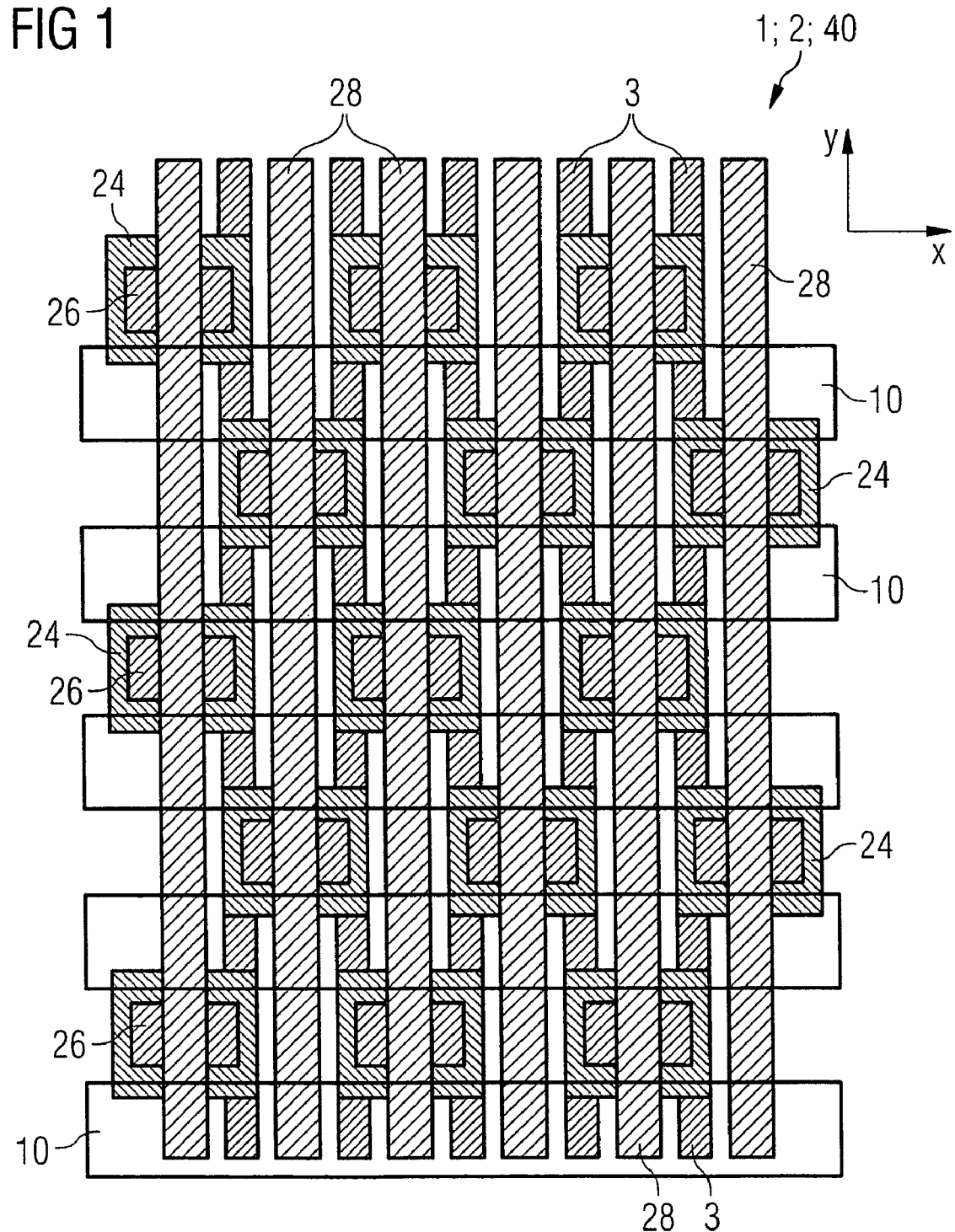
FIG. 1 is a schematical top view of the semiconductor product according to the invention.

FIG. 1 illustrates a top view of a semiconductor product 1, in particular a flash memory product, comprising a plurality of memory cells arranged in a virtual ground array. In a substrate 2, a plurality of line-shaped active areas 3 are formed by implanting a dopant in the substrate 2. The substrate 2 can be a bulk semiconductor substrate or a layer or region over or in a substrate. The substrate further comprises line-shaped trench insulation fillings. In FIG. 1 the trench isolation fillings are not visible since they are provided at the same lateral positions as the bitlines 28. Each line-shaped active area 3 is arranged between two respective line-shaped trench isolation fillings.

For clarity of illustration, in FIG. 1 the active areas 3 are designed narrower than the bitlines. In an actual semiconductor product, however, the active areas 3 have approximately the same width along the first direction x as the bitlines 28 or as the trench isolation fillings provided between the active areas 3.

FIG. 1 further illustrates wordlines 10 arranged at a distance from one another along a second direction y and extending along the first direction x. FIG. 1 further illustrates contact structures 24 each arranged between two respective wordlines 10 and each contacting two respective line-shaped active areas 3. On the contact structures 24, bitline contacts 26 are provided and on the bitline contacts 26 bitlines 28 are provided. By the bitline contacts 26 each bitline 28 is connected to a plurality of contact structures 24.

In FIG. 1 the bitline contacts 26 are designed wider than the bitlines 28 for clarity of illustration. In an actual semiconductor product, however, the width of the bitline contacts 26 corresponds to the width of the bitlines 28 along the first direction x.

On a surface of the substrate 2 a charge-trapping layer is provided. The charge-trapping layer may be a silicon nitride layer contained in an ONO layer stack (oxide-nitride-oxide). The ONO layer stack may be present, for instance, all over the substrate surface except for those regions of the substrate surface where the contact structures 24 are provided. In this case, the formation of the contact hole fillings includes etching through the ONO layer stack. Alternatively, prior to formation of the contact structures 24, the ONO layer stack may be present on the active areas exclusively, for instance, and may be absent on the trench isolation fillings. In any case, the contact structures 24 are in contact with the substrate surface and each contact structure 24 contacts two line-shaped active areas 3. Since a nitride layer of the ONO stack serves as a charge-trapping layer for storing electrical charges in locally bound positions, an NROM memory product is provided, those portions of the line-shaped active areas 3 being covered with the contact structures 24 forming source/drain electrodes. The contact structures 24 are arranged in rows along the first lateral direction x. When comparing the contact structures 24 of two adjacent rows, the contact structures 24 have a lateral offset in direction x with respect to one another. The contact structures 24 are provided in spaces between the wordlines 10. The wordlines 10 have been formed prior to forming the contact structures 24.

FIGS. 2 to 14B illustrate a semiconductor product during method steps of a method according to the invention.

Figure 2:
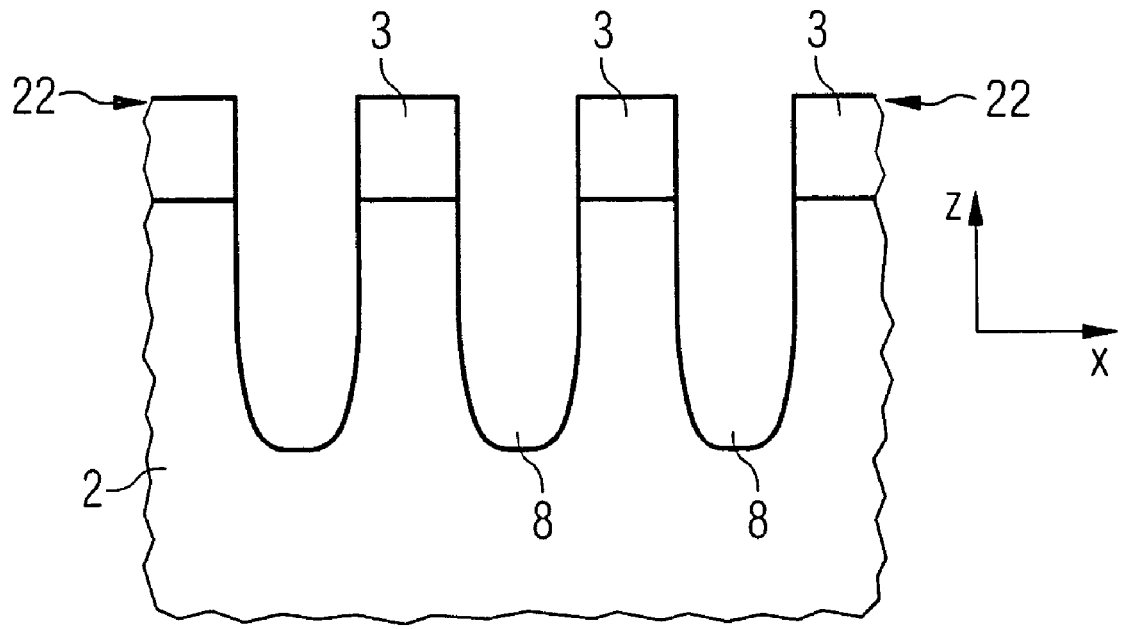

According to FIG. 2 a semiconductor substrate 2 is provided, the substrate 2 having a substrate surface 22. The substrate further comprises active areas 3 formed by implantation of a dopant into the substrate 2. The substrate further comprises trenches 8 formed line-shaped, having their main extension in direction perpendicular to the drawing plane. The trenches 8 have been etched into the substrate preferably after implanting the dopant for forming the active areas 3. Thereby line-shaped active areas 3 are formed, each line-shaped active area 3 being confined in the first direction x by two adjacent line-shaped trenches 8.

Figure 3:
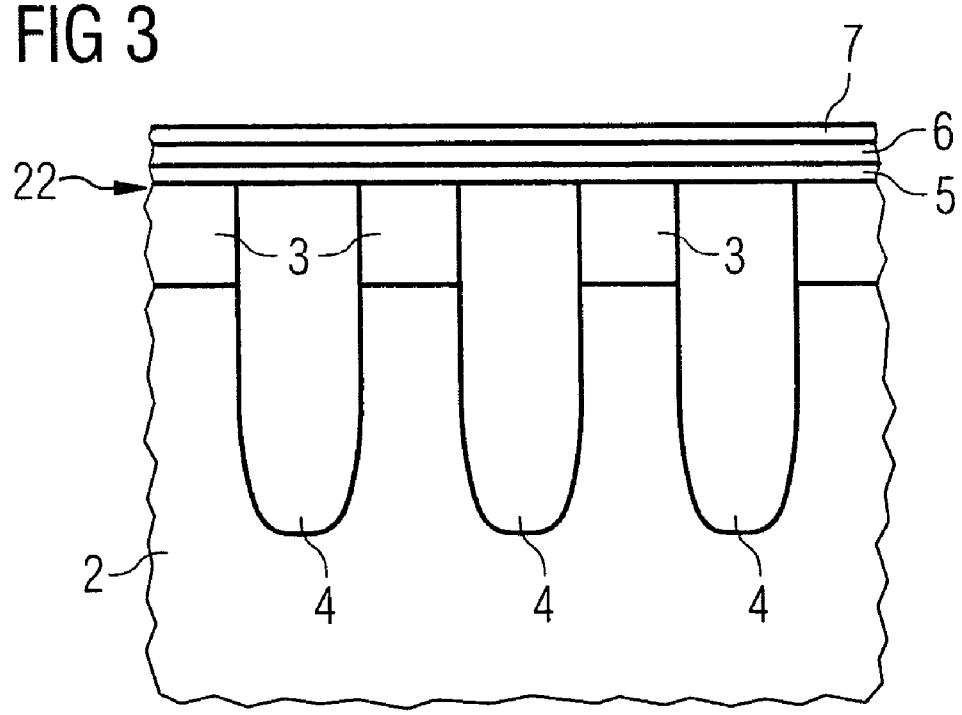

The trenches 8 are then filled with trench isolation fillings 4 (FIG. 3). The trench isolation fillings 4 comprise a dielectric material. Filling the trenches 8 with the trench isolation filling 4 may be performed by depositing a dielectric material into the trenches 8 and on top of the substrate surface 22 and subsequently removing (for instance, by polishing) the dielectric material from the substrate surface 22.

As illustrated in FIG. 3, on the substrate surface 22 a layer stack is formed by depositing a bottom oxide layer 5, a charge-trapping layer 6 and a top oxide layer 7 on one another. The bottom oxide layer 5 is deposited on the substrate surface 22 and covers the active areas 3 and the trench isolation fillings 4. The charge-trapping layer 6 preferably is formed of silicon nitride and serves for storing electrical charges in locally bound positions.

FIGS. 4A and 4B illustrate two cross-sectional views of the semiconductor product after formation of wordlines. FIG. 4A illustrates a cross-sectional view parallel to the wordlines and FIG. 4B illustrates a cross-sectional view perpendicular to the wordlines. According to FIG. 4A a wordline 10 extending along the first direction x is formed on the layer stack of the bottom oxide layer 5, the charge-trapping layer 6 and the top oxide layer 7. In FIG. 4B the cross-sectional shape of the wordlines 10 as well as the vertical structure of the wordlines is illustrated. The wordlines 10 may comprise a first layer 31, a second layer 32 and a third layer 33, for instance. The first layer 31 may be a polysilicon layer and the second layer 32 may be a conductive layer having an electrical conductivity higher than the conductivity of the polysilicon layer. The second layer 32 may comprise tungsten. For instance, the second layer 32 may be a tungsten silicide layer. The third layer 33 may be a nitride cap layer protecting the first layer 31 and the second layer 32 during patterning of the wordlines. The wordlines are formed by depositing the first, second and third layers 31, 32 and 33 on one another and patterning them subsequently, patterning being finished in the bottom oxide layer 5, for instance. An optional additional step of shaping the cross-sectional wordline profile may be performed in order to achieve a slope of the wordline sidewalls. Thereby tapered wordlines having a width along a second (lateral) direction y, which decreases with increasing distance from the substrate surface, are formed. Accordingly, the first layer 31 of the wordlines 10 is wider than the third layer 33 thereof. The slope of the wordline sidewalls may be between 2° and 8° relative to the normal to the substrate surface, for instance about 5°. After having patterned the first, second and third layers 31, 32, 33 of the wordlines 10, n-doped LDD implants (lightly doped drain), pocket implants and/or modifications thereof are implanted through the stack of layers 5, 6 and 7 in those regions of the substrate surface disposed between respective two adjacent wordlines 10.

FIGS. 4A and 4B each illustrate a cross-sectional view of a portion of a memory array 40 of the memory product 1. The memory array 40 is illustrated in FIG. 1 in top view. Preferably, the memory product 1 further comprises a periphery region 50 for accessing and controlling the memory array 40 (as will be described later with reference to FIG. 15).

FIG. 4C illustrates a cross-sectional view of the periphery region 50 in which further transistors (like high voltage or mid voltage transistors, for instance) are to be formed. The transistors arranged in a periphery region are connected to conductive lines being wider than the wordlines formed in the memory array 40. Furthermore, such transistors comprise a gate dielectric like a gate oxide (rather than an ONO layer stack) below the conductive line. Accordingly, FIG. 4C illustrates a conductive line 15 that, though comprising the same first 31, second 32 and third 33 layers as the wordlines 10 of the memory array 40, is wider in lateral direction. Accordingly, a transistor formed using the conductive line 15 as a gate electrode has a larger gate length and is operable at higher operating voltages than the transistors of the NROM cells formed in the memory array 40. FIGS. 4A, 4B and 4C illustrate the semiconductor product 1 at the same step of the method according to the invention. Accordingly, the wordlines 10 of the memory array 40 and the conductive lines 15 of the periphery region 50 are formed simultaneously by means of the same respective deposition and etching steps.

According to FIG. 5 thin spacers 34 are formed on sidewalls of the wordlines 10. Though only illustrated for the wordlines 10 of the memory array, optionally at the same time first spacers may be formed on sidewalls of conductive lines 15 arranged in the peripheral region 50 (FIG. 4C). The thin spacers 34 may be oxide spacers. During spacer etch, the ONO-layer stack of the top oxide layer 7, the charge-trapping layer 6 and the bottom oxide layer 5 may be patterned, in the step of patterning etching being stopped on the substrate surface.

Optionally, an oxide liner 35 may be deposited as illustrated in FIGS. 6A and 6B. Preferably, the optional oxide liner 35 is also deposited on the (second) wordlines 15 in the periphery region 50 (FIG. 6C). The oxide line 35 covers the sidewalls and top sides of the wordlines 10, 15 as well as substrate surface portions disposed between the wordlines. The provision of an oxide liner 35 on the first thin spacers 34 improves electrical insulation of the wordlines 10, 15 since it reduces the risk of local short circuits in view of the small thickness of the thin spacers 34. Subsequent to deposition of the oxide liner 35, p-dopants may be implanted for forming the p-doped LDD regions (lightly doped drain). In particular, the p-doped LDD regions may be doped with boron, which diffuses more easily within the substrate 2 during thermal anneal.

Whereas the method steps described hereinabove with reference to FIGS. 2 to 6C correspond to conventional semiconductor manufacturing, according to embodiments of the invention the method continues with forming auxiliary structures 20 between the wordlines 10 as illustrated in FIGS. 7A and 7B. The plurality of auxiliary structures 20 can be formed by depositing an auxiliary layer 20c encapsulating the wordlines, portions of the auxiliary layer 20c arranged between two respective wordlines forming a respective auxiliary structure 20. Alternatively, forming the auxiliary structures 20 may include, at this stage of the method or at a later stage, back-etching of material of the auxiliary layer 20c, thereby leaving a plurality of auxiliary structures 20 separated from one another by a respective wordline.

The auxiliary structures 20 comprise a top side 20a and a bottom side 20b, the bottom side 20b being arranged comparatively close to the substrate surface 22 and the top side 20a being arranged comparatively distant from the substrate surface 22. In case of back-etching of the auxiliary layer, the distance of the top sides of the auxiliary structures from the substrate surface is reduced. The auxiliary structures 20 are filling the spaces between the wordlines 10 as apparent from FIG. 7B. FIG. 7A illustrates the cross-sectional view through a region of an auxiliary structure 20 along its main direction parallel to the wordlines.

The method according to embodiments of the invention then proceeds with patterning the auxiliary structures, thereby forming trenches through the auxiliary structures, which trenches are extending down to the semiconductor surface. FIGS. 7A and 7B illustrate that a mask 19 has been deposited on the auxiliary structures 20 and that the mask 19 has been patterned. The mask 19 preferably is a hardmask serving to pattern the auxiliary structures 20 from their top surface 20a down to the their bottom surface 20b.

Figure 8A:
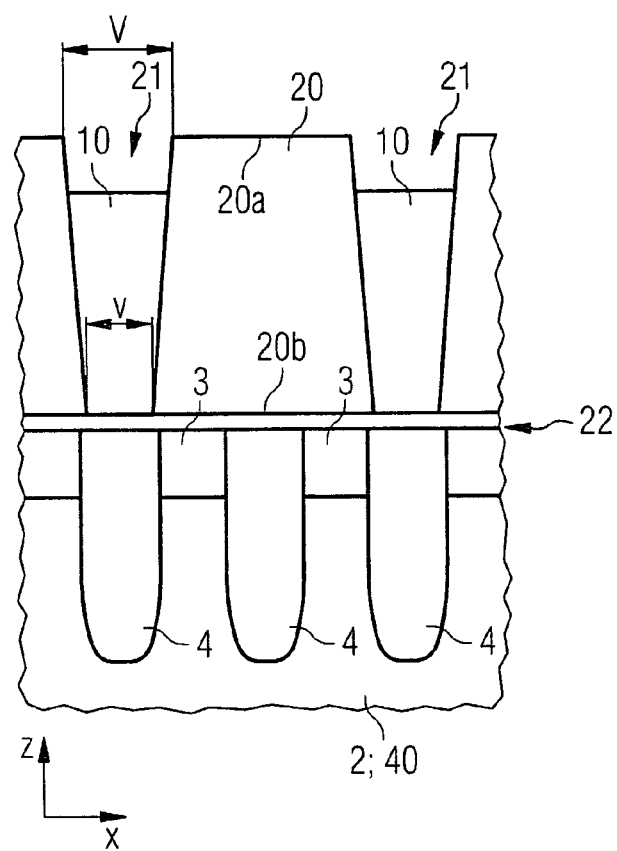
Figure 8B:
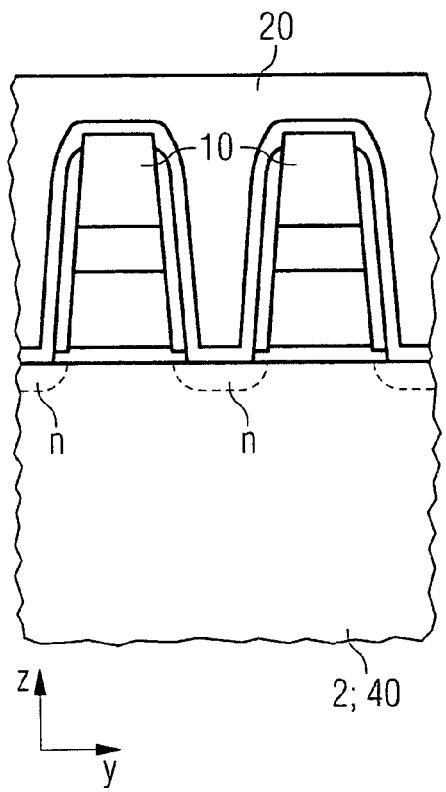

As illustrated in FIGS. 8A and 8B, the auxiliary structures 20 have been patterned by etching trenches 21 into the auxiliary structures 20, thereby exposing portions of the wordlines 10, which portions are arranged at the same positions along the first direction x as the trench isolations fillings 4. In FIGS. 8A and 8B the hardmask 19 (FIGS. 7A and 7B) has been removed. As apparent from FIG. 8A, the etching profile of the trenches 21 is non-uniform along the height of the auxiliary structures 20. In particular, at the top sides 20a of the auxiliary structures 20 the width V of the trenches 21 along the first direction x is larger than the width v of the trenches 21 at the bottom side 20b of the auxiliary structures 20. Accordingly the width of the trenches 21, measured along the first direction x parallel to the wordlines, increases with increasing distance from the substrate surface 22. According to embodiments of the invention, the trenches 21 will be filled with isolating fillings structures and the auxiliary structures 20 will be removed later and will be replaced with conductive material for forming the contact structures connecting the active areas to the bitlines. Accordingly, the tapered cross-sectional shape of the trenches 21 etched into the auxiliary structures 20 defines the cross-sectional shape of the contact structures to be formed later. In FIG. 8A it is apparent that the bottom side 20b of an auxiliary structure 20 extends laterally beyond two active areas 3 in the first direction x and partially overlaps with portions of two further trench isolation fillings 4.

FIG. 8B illustrates the cross-sectional shape in a direction perpendicular to the wordlines. The cross-sectional view of FIG. 8B is taken through the centered trench isolation fillings 4 of FIG. 8A.

According to FIGS. 7A, 7B and 8A, 8B, as described herein above, auxiliary structures 20 have been formed by depositing a material and patterning by means of a mask 19. The material of the auxiliary structures 20 may be polysilicon, for instance.

Figure 8C:
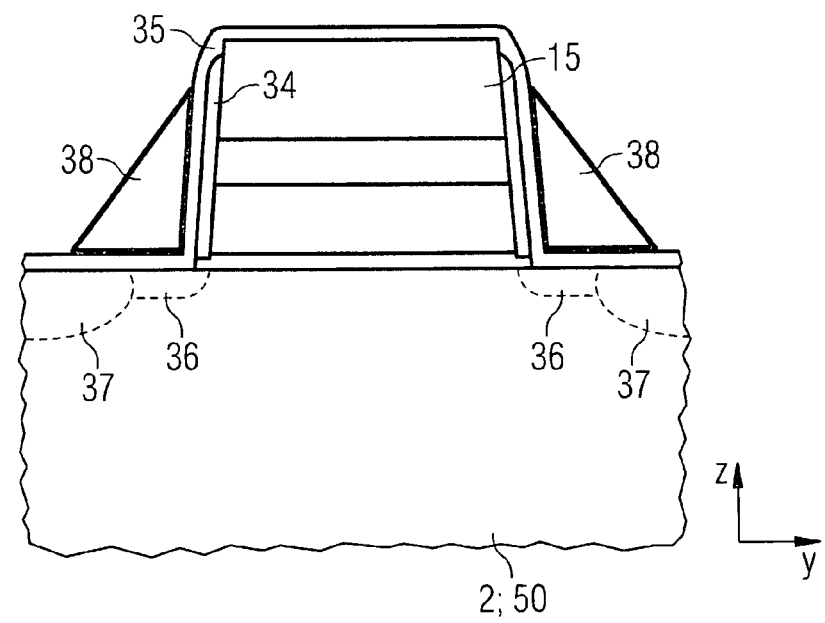

Optionally, the material for forming the auxiliary structures 20 may also be deposited on the peripheral region 50 of the semiconductor product and may be etched in the peripheral region 50 simultaneously to etching the trenches 21 therein (FIG. 8A). Thereby spacers 38 are formed in the peripheral region 50 on sidewalls of the conductive lines 15 (FIG. 8C). The spacers 38 may be deposited on the oxide liner 35, if present. The spacers 38 may be used to implant source/drain regions 37 (FIG. 8C) at the lateral distance from the conductive lines 15 without the need to provide an additional mask for achieving the lateral offset of the source/drain regions 37 relative to the conductive lines 15. LDD-regions 37 (lightly doped drain) however are implanted close to the conductive lines 15 prior to the formation of the polysilicon spacers 38. The source/drain regions 37, however, are implanted only after formation of the polysilicon spacers 38. The spacers 38 may be maintained after completion of the transistors in the periphery region 50 or otherwise may be removed when the auxiliary structures 20 (FIGS. 8A and 8B) will be removed.

Whereas FIG. 8C illustrates spacers 38 deposited simultaneously with depositing the auxiliary structures, spacers alternatively can be deposited by a separate process step in the peripheral region. For instance, a spacer may be deposited separately and may later be removed selectively to the oxide liner. Furthermore, optionally an additional nitride liner (not illustrated) may be deposited on the oxide liner 35 in the peripheral region and spacers (for instance made of an oxide) may be formed thereon. The oxide spacers may be removed selectively to the nitride liner in the peripheral region after the source/drain regions have been formed. In this case, no polysilicon spacers 38 need to be formed in the peripheral region at the time when the auxiliary structures 20 are formed in the memory array.

Figure 9A:
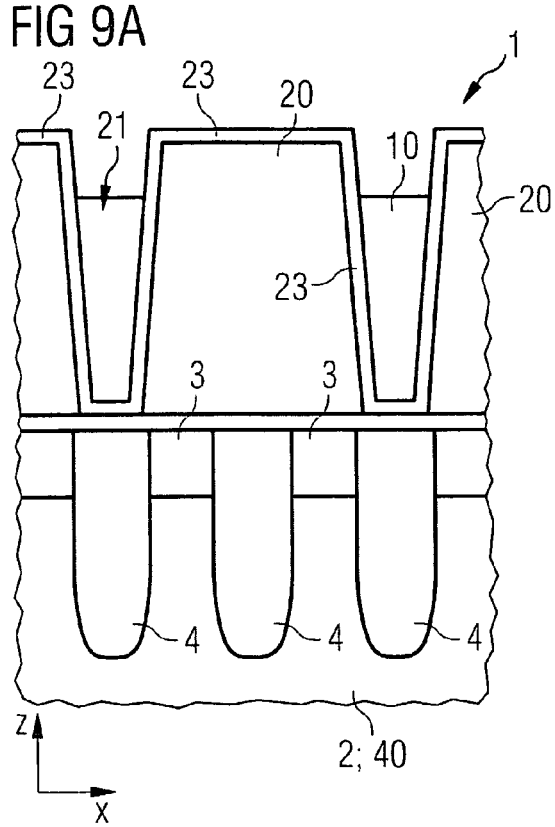
Figure 9B:
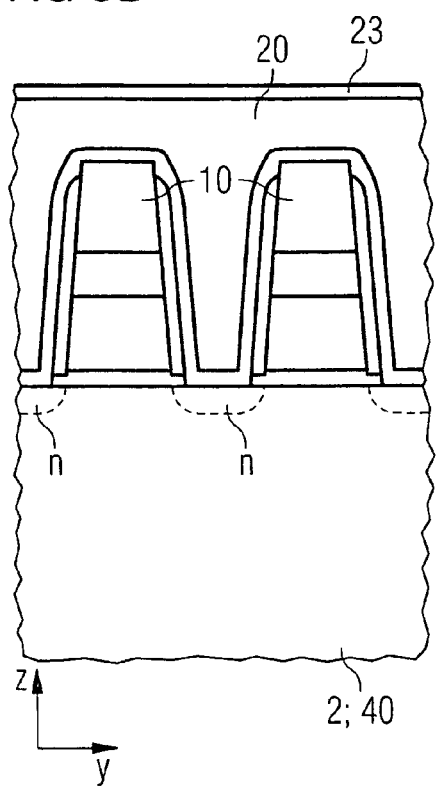

FIGS. 9A and 9B illustrate an optional additional step of depositing a dielectric liner 23, for instance a silicon nitride liner on the semiconductor product. The nitride liner 23 may be deposited on the memory array 40 of the semiconductor product such as to cover the sidewalls and top surfaces of the auxiliary structures 20 and the bottom and the sidewalls of the trenches 21. The dielectric layer 23 deposited in the trenches 21 allows to form the auxiliary structures 20 of an electrically conducting material (like a doped material) to be deposited on the dielectric liner 23, the dielectric liner 23 preventing electrical contact of the electrically conductive material of the trenches 21 with the material of contact structures (to be formed later at positions where the auxiliary structures 20 are present in FIGS. 9A and 9B). The dielectric liner 23 may also be deposited in case that the auxiliary structures will be formed of an electrically insulating material. The dielectric liner 23 further may serve as a diffusion barrier.

The optional dielectric liner 23 may simultaneously be deposited on the peripheral region of the semiconductor product (not illustrated) in order to cover the sidewalls and top surfaces of the conductive lines 15 (FIG. 8C) and the regions of the substrate surface between the conductive lines 15. Deposition of the optional dielectric liner 23 then allows to subsequently form dielectric oxide spacers (as described above for the case that no polysilicon spacers 38 have been formed when forming the auxiliary structures 20) on the sidewalls of the conductive lines 15. A dielectric liner 23 deposited in the peripheral region allows selective removal of the silicon oxide spacers selectively to the dielectric liner 23.

Figure 10A:
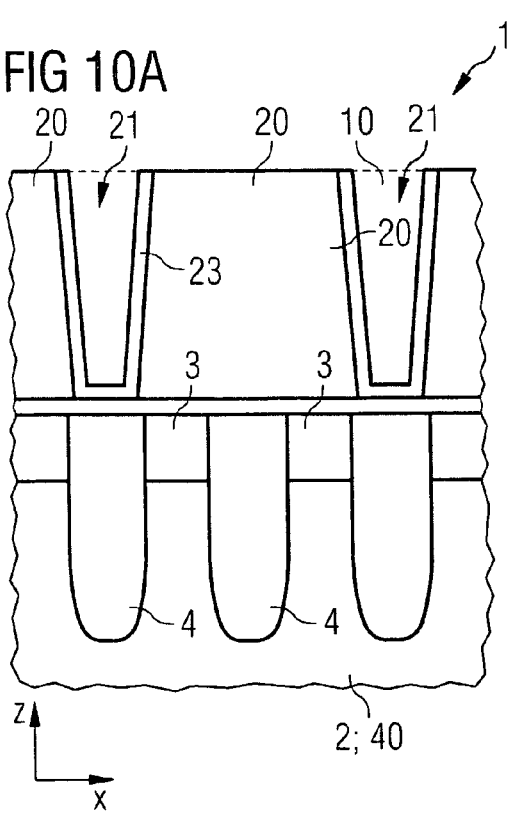
Figure 10B:
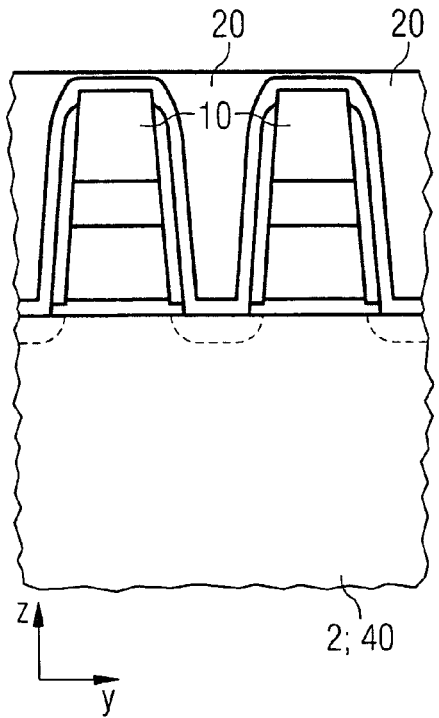

According to FIGS. 10A and 10B a top surface of the semiconductor product 1 is planarized, for instance by chemical-mechanical polishing. Thereby upper portions of the auxiliary structures 20 are removed. The lateral extension of the maintained portions of the auxiliary structures 20, in direction x perpendicular to the wordlines, now is confined by the wordlines 10. The trenches 21 are confined in a lateral direction by the auxiliary structures 20 (in the first direction x) and by the wordlines 10 (in the second direction y).

Figure 11A:
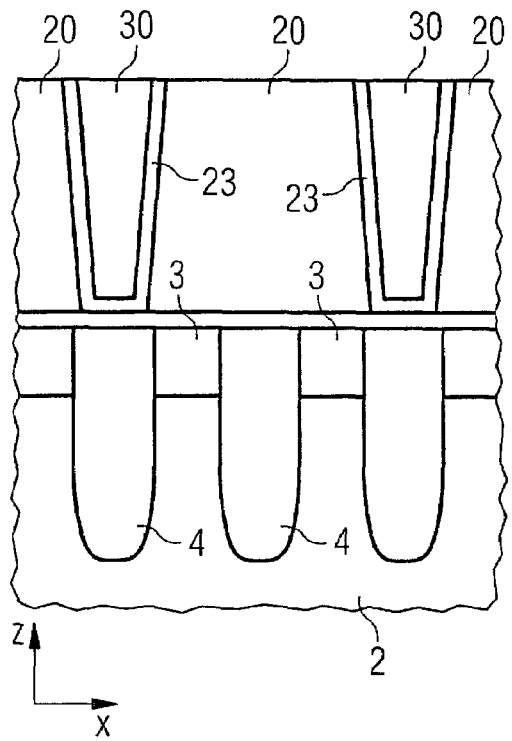
Figure 11B:
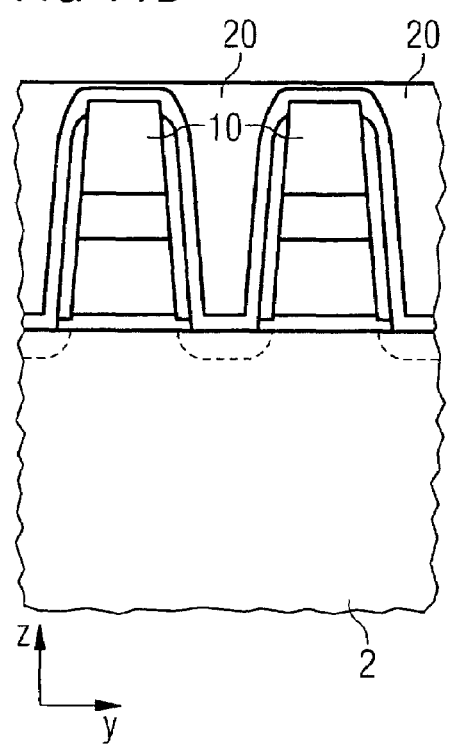

According to FIGS. 11A and 11B filling structures 30 are formed in the trenches 21 (FIG. 10A), for instance by depositing a dielectric or conductive material all over the memory array and by planarizing or back-etching an upper portion thereof. The filling structures 30 may be formed of a dielectric material since they serve to electrically insulate respective two contact structures (to be formed where the auxiliary structures 20 are present in FIG. 11A) from one another. The filling structures 30 may comprise the optional dielectric liner 23. However, the filling structures 30 may also be formed without any dielectric liner. In this case, the filling structures 30 should be formed of an electrically insulating material. In FIGS. 11A to 14A the dielectric liner 23 is present. However, it is to be noted that the dielectric 23 is optional and need not be present in the semiconductor product of the present invention.

Figure 12A:
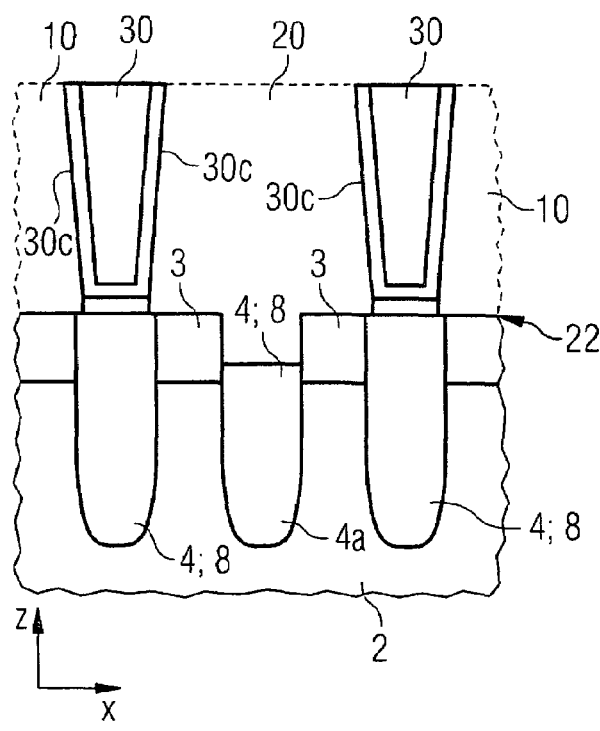
Figure 12B:
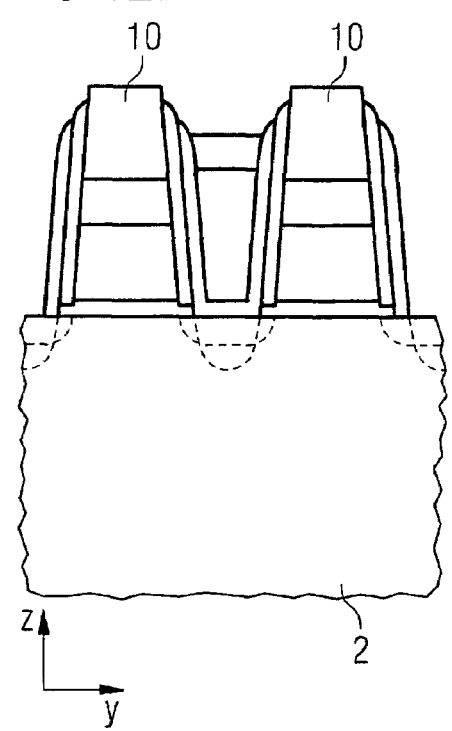

As illustrated in FIGS. 12A and 12B, the auxiliary structures 20 (FIG. 11A) are removed, for instance by wet etching or dry etching. Thereby sidewalls 30c of the filling structures 30 are exposed. By removing the auxiliary structures 20, recesses to be filled with the contact structures for contacting the active areas 3 are etched. To this end the auxiliary structures are completely removed, thereby exposing top surfaces of the active areas 3 at the substrate surface 22.

FIG. 12A further illustrates a preferred embodiment according to which etching is continued after the substrate surface 22 is exposed. Due to continued etching, upper portions of trench isolation fillings 4a arranged in the trenches of the substrate 2 are back-etched. Thereby sidewalls of the active areas 3 are exposed. Accordingly, continued etching serves to expose top surfaces as well as sidewalls of the active areas 3 in order to improve the electrical contact of the active areas 3 to contact structures to be formed thereon. By continued etching in FIG. 12A, in particular those trench isolation fillings 4a arranged between the active areas 3 may be recessed significantly.

Figure 13A:
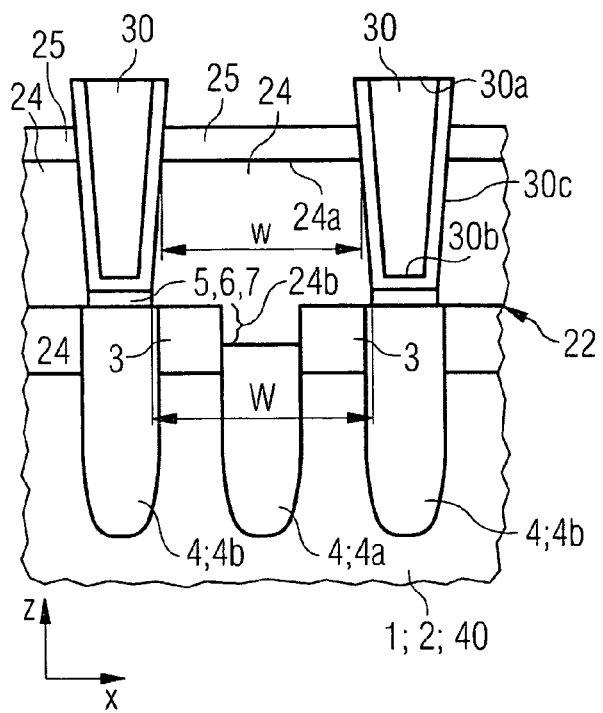
Figure 13B:
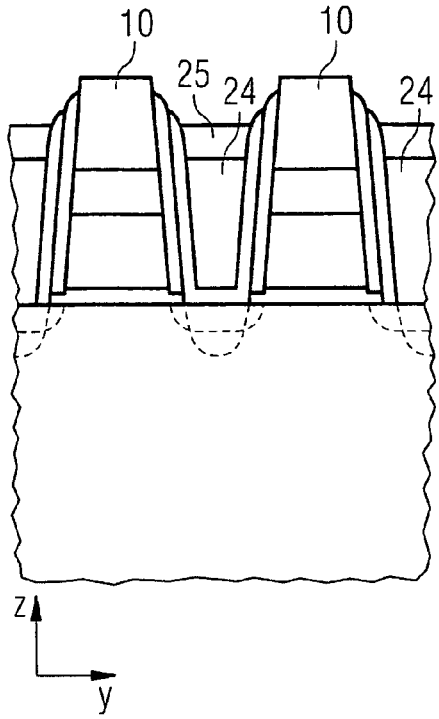

According to FIGS. 13A and 13B the contact structures 24 are formed. The contact structures 24 are formed in recesses laterally confined by the wordlines 10 (along the second direction y) and by the filling structures 30 (along the first direction x). The contact structures 24 accordingly cover those regions of the substrate surface 22 that previously were covered with the auxiliary structures 20. Since the filling structures 30 had been formed in trenches etched in the auxiliary structures 20, the fillings structures 30 at their bottom side 30b are slightly smaller in lateral direction compared to the critical dimension, that is to the width of the active areas 3 (or the width of the trench isolation fillings 4 in direction x parallel to the wordlines). The top sides 30a of the filling structures are slightly wider, along the direction x parallel to the wordlines 10, than the critical dimension. Accordingly, the fillings structures 30 comprise inclined sidewalls 30c at those sides having a normal direction facing to positive and negative first lateral direction x. The slope of the sidewalls 30c of the filling structures 30 may be between 2° and 8°, for instance about 5°.

Due to the inclined sidewalls 30c of the filling structures 30, the contact structures 24 also comprise inclined sidewalls (in addition to the two further inclined sidewalls abutting to the inclined wordline sidewalls) and the contact structures 24 at their top side 24a are slightly smaller in direction x (parallel to the wordlines 10) than at the substrate surface 22. In particular, the contact structures 24 along the first direction x laterally extend beyond the active areas 3 contacted. Accordingly, the contact structures 24 are in contact with portions of trench isolation fillings 4b on which the respective two adjacent filling structures 30 are provided. As a consequence, even in case of the lateral misalignment of the mask 19 (FIG. 7A) along the first direction x, the complete top sides of both contacted active areas 3 are in contact with the contact structure 24. Thereby safe and low-resistive connection between the active areas 3 and the contact structure 24 is achieved even in the case that the contact structure 24 is laterally offset along the first direction x due to a misalignment of a lithographic mask.

Whereas according to prior art the width of the contact structures 24 corresponds to the distance between two respective trenches 4b supporting the adjacent filling structures 30, according to embodiments of the invention a contact structure 24 is provided, which is wider at its bottom side than at its top side. At the bottom of the contact structure 24, the contact structure 24 according to embodiments of the invention has a width W along the first direction x being larger than a width w of the top side 24a of the contact structures 24 along the first direction. This compensates lateral misalignments of the contact structures 24 with respect to the active areas 3 contacted thereby and no risk of reducing the contact surface between the contact structure 24 and the active areas 3 occurs any longer.

In case that etching of the auxiliary structures is continued after exposing of the substrate surface 22 during etching, the trench isolation fillings are recessed and sidewalls of the active areas 3 are in contact with a contact structure portion 24b extending below the substrate surface 22. Thereby a considerable additional increase of the contact surface between the active areas 3 and the contact structure 24 is achieved.

According to a preferred embodiment of the invention, the contact structures 24 are formed of a semiconductor material. Whereas according to prior art metal or metal alloys are used for forming the contact structures 24, according to the preferred embodiment a semiconductor material is used thereby avoiding a metal-semiconductor-interface surface on the substrate surface 22. Thereby the electrical contact of the contact structures 24 to the active areas 3 is improved.

Preferably the contact structures 24 are formed by selective growth on the substrate surface 22 exposed between the wordlines 10 and the filling structures 30. Preferably the contact structures 24 are grown epitaxially on the substrate surface 22. A benefit of selective, epitaxial growth of contact structures 24 made of a semiconductor material is that formation of the contact structures 24 may be performed using vapor deposition (like chemical vapor deposition, for instance). An initial heating step in a low-pressure atmosphere at the beginning of vapor deposition removes any thin oxide (like native oxide) present on the active areas 3. When the semiconductor material of the contact structures 24 is subsequently deposited on the active areas 3, an extremely low-resistive electrical contact is achieved.

In order to reduce the electrical resistance between bitlines to be formed and the contact structures 24, preferably a metallic silicide layer 25 is formed on each contact structure 24 as further illustrated in FIGS. 13A and 13B. Preferably the silicide layers 25 cover the complete top sides 24a of the contact structure 24, each silicide layer 25 accordingly extending from a sidewall 30c of one filling structure 30 to a respective sidewall 30c of another filling structure 30. Since a silicide layer 25 (like a cobalt silicide layer) is conductive, a metal-semiconductor-interface surface is present at the top sides 24a of the contact structures 24. However, due to the large width of the top sides 24a of the contact structures 24 in direction x parallel to the wordline 10, a comparatively low-resistive contact is achieved.

Figure 14A:
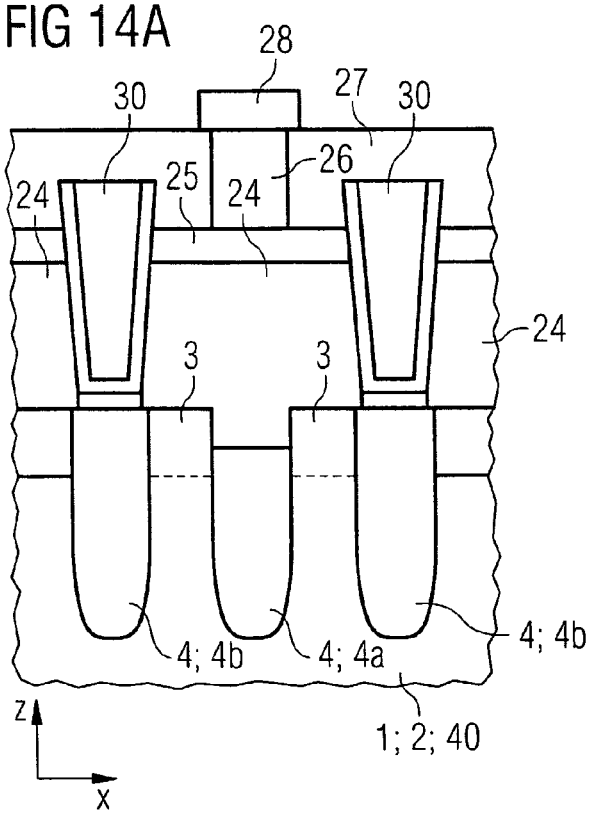
Figure 14B:
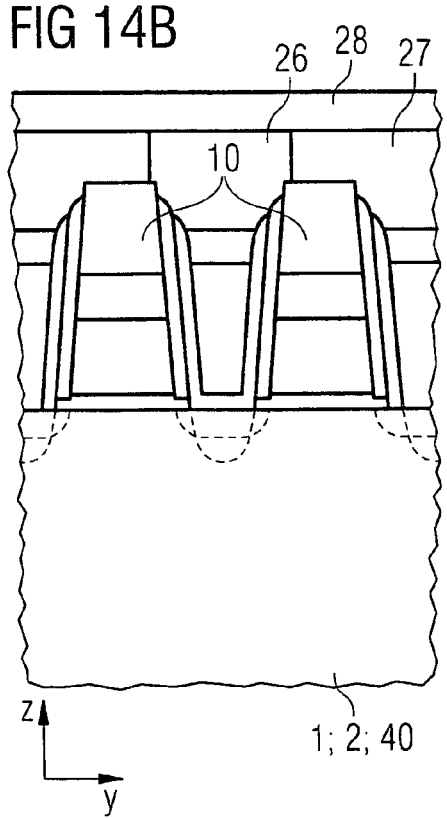

According to FIGS. 14A and 14B bitline contacts 26 are formed on the respective silicide layer 25. In case that no silicide layer 25 is present, the bitline contacts 26 are formed on the top sides 24a of the contact structures 24 directly. The bitlines contacts 26 serve to connect the contact structures 24 to bitlines 28. The bitline contacts 26 may be formed using a damascene process in trenches in a dielectric layer, the trenches extending to the top side of the silicide layer 25 or, in the absence of the silicide layer, to the top side of the contact structures 24. Finally, bitlines 28 are formed on the bitline contacts 26, each bitline 28 contacting a plurality of bitline contacts 26 as illustrated in FIG. 1 in top view.

The present invention provides a low-resistive electrical connection between the active areas 3 and the bitlines 28 even in the case where the contact structures 24 are laterally misaligned, due to lithographic misalignments along the direction x parallel to the main extension of the wordlines. Further reduction of the electrical resistance between the active areas 3 and the bitlines 28 is achieved by embodiments using contact structures 24 partially extending below the substrate surface thereby contacting sidewalls of the active areas 3 or by using contact structures 24 formed of a semiconductor material (like monocrystalline silicon or polysilicon) or by providing metallic silicide layers 25 covering the complete top side of the contact structures 24.

Finally, FIG. 15 schematically illustrates a semiconductor product 1 comprising a memory array 40 as well as a periphery region 50, the memory array 40 comprising a plurality of memory cells schematically illustrated in FIG. 15. An exemplary actual arrangement of the memory cells and their connections to the wordlines and bitlines is illustrated in FIG. 1.

What is claimed is:

1. A method for forming a semiconductor product, the method comprising:

provifing a substrate having a substrate surface;

forming wordlines arranged at a distance from one another and running along a first direction parallel to the substrate surface;

forming auxiliary structures between the wordlines, the auxiliary structures filling spaces between the wordlines above the substrate surface and having a top side and a bottom side, a distance between the top side and the substrate surface being larger than a distance between the bottom side and the substrate surface;

patterning the auxiliary structures thereby forming trenches extending through the auxiliary structures from the top sides to the bottom sides, in each auxiliary structure plural trenches being formed, which trenches are arranged at a distance from one another along the first direction, the trenches having a width along the first direction being larger at the top side of the auxiliary structures than at the bottom side of the auxiliary structures;

filling the trenches formed in the auxiliary structures with filling structures;

removing the auxiliary structures by etching, thereby exposing sidewalls of the filling structures; and forming conductive contact structures for contacting the substrate surface in between the filling structures, the contact structures having a top side provided at a distance from the substrate surface, the contact structures extending to the substrate surface and having a width at the substrate surface, which width along the first direction is larger than a width of the top sides of the contact structures along the first direction.

2. The method of claim 1, wherein forming conductive contact structures includes growing the contact structures selectively on portions of the substrate surface exposed between the wordlines and the filling structures.

3. The method of claim 2, wherein forming conductive contact structures includes epitaxially growing the contact structures selectively on the exposed substrate surface portions.

4. The method of claim 1, wherein forming conductive contact structures comprises growing silicon on exposed portions of the substrate surface.

5. The method of claim 4, wherein growing silicon comprises growing doped polysilicon or doped monocrystalline silicon.

6. The method of claim 1, wherein forming conductive contact structures comprises growing carbon or germanium on the substrate surface.

7. The method of claim 1, wherein patterning the auxiliary structures includes forming a mask on the auxiliary structures, the mask having mask openings extending perpendicular to the first direction, and anisotropically etching the auxiliary structures through the mask.

8. The method of claim 1, wherein filling the trenches includes depositing a dielectric material into the trenches.

9. The method of claim 8, wherein filling the trenches includes forming a silicon nitride liner in the trenches prior to filling the trenches.

10. The method of claim 1, wherein filling the trenches comprises forming electrically insulating filling structures.

11. The method of claim 1, wherein removing the auxiliary structures includes selectively etching portions of the auxiliary structures maintained between the filling structures.

12. The method of claim 1, wherein providing a substrate comprises providing a substrate comprising active areas formed line-shaped and extending along a second direction different from the first direction, the substrate further comprising trenches arranged between the active areas and filled with trench isolation fillings, each trench isolation filling being formed line-shaped and isolating two respective active areas from one another.

13. The method of claim 12, wherein removing the auxiliary structures comprises continuing to etch after the substrate surface at a bottom side of the portions the auxiliary structures is exposed, thereby recessing trench isolation fillings arranged in the trenches between two respective active areas.

14. The method of claim 12, wherein forming conductive contact structures comprises forming contact structures that each contact two respective active areas and pass across one respective trench isolation filling.

15. The method of claim 1, wherein the method further comprises:

forming bitline contacts electrically contacting the contact structures; and forming bitlines on the bitline contacts.

16. The method of claim 15, wherein, prior to forming the bitline contacts, a dielectric layer is deposited and the bitline contacts are formed in vias of the dielectric layer.

17. The method of claim 15, wherein between forming the conductive contact structures and forming the bitline contacts, metallic silicide layers are formed on the top sides of the contact structures, each silicide layer extending between sidewalls of respective two filling structures disposed adjacent to a respective contact structure, and wherein the bitline contacts are formed at centered positions of upper surfaces of the respective silicide layer.

18. The method of claim 1, wherein the substrate further comprises a charge-trapping layer sandwiched between a top oxide layer and a bottom oxide layer, the bottom oxide layer being disposed on the substrate surface.

19. The method of claim 1, wherein forming auxiliary structures comprises depositing polysilicon and etching the deposited polysilicon.

20. The method of claim 1, wherein the wordlines are wordlines provided in a memory array and wherein the method further includes forming conductive lines for transistors in a periphery region, the method further comprising forming on sidewalls of the conductive lines at the same time as forming the auxiliary structures.

21. The method of claim 20, wherein source/drain regions are formed in the periphery region by implantation of dopants, the spacers being used as an implantation mask during implantation of the dopants.

22. The method of claim 21, wherein the spacers are removed when the auxiliary structures are patterned.

* * * * *